United States Patent
Lee et al.

(10) Patent No.: US 12,482,690 B2
(45) Date of Patent: Nov. 25, 2025

(54) SUBSTRATE PROCESSING APPARATUS

(71) Applicant: SAMSUNG ELECTRONICS CO., LTD., Suwon-si (KR)

(72) Inventors: Youngbok Lee, Suwon-si (KR); Yihwan Kim, Suwon-si (KR); Seongkeun Cho, Suwon-si (KR); Sangchul Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 18/323,719

(22) Filed: May 25, 2023

(65) Prior Publication Data

US 2024/0145288 A1  May 2, 2024

(30) Foreign Application Priority Data

Oct. 31, 2022 (KR) .................. 10-2022-0142421

(51) Int. Cl.
*H01L 21/683* (2006.01)
*C23C 16/458* (2006.01)

(52) U.S. Cl.
CPC ...... *H01L 21/6833* (2013.01); *C23C 16/4583* (2013.01); *H01L 21/683* (2013.01)

(58) Field of Classification Search
CPC .............. H01L 21/683; H01L 21/6833; H01L 21/67103; H01L 21/6875; C23C 16/458; C23C 16/4583
USPC ....................................................... 361/234
See application file for complete search history.

(56) References Cited

U.S. PATENT DOCUMENTS

| | | | |
|---|---|---|---|
| 4,603,867 A | 8/1986 | Babb et al. | |
| 5,583,736 A | 12/1996 | Anderson et al. | |
| 6,028,762 A | 2/2000 | Kamitani | |
| 6,221,201 B1 | 4/2001 | Tamura et al. | |
| 6,741,447 B2 | 5/2004 | Lee | |
| 10,418,266 B2 * | 9/2019 | Horiuchi | H01L 21/6831 |

(Continued)

FOREIGN PATENT DOCUMENTS

| | | |
|---|---|---|
| KR | 20030067815 A | 8/2003 |
| KR | 100422444 B1 | 3/2004 |
| KR | 20210120806 A | 10/2021 |

*Primary Examiner* — Danny Nguyen
(74) *Attorney, Agent, or Firm* — Wolf, Greenfield & Sacks, P.C.

(57) ABSTRACT

A substrate processing apparatus includes a chamber providing a space where a semiconductor process is performed on a semiconductor substrate, a substrate plate configured to support the semiconductor substrate, the substrate plate having a central region and a peripheral region surrounding the central region, a central embossing pattern on the central region and configured to support a central portion of the semiconductor substrate, a plurality of first embossing patterns radially arranged around the central embossing pattern on the peripheral region, each of the plurality of first embossing patterns extending radially outward from the central embossing pattern with a first length, and a plurality of second embossing patterns respectively provided between the first embossing patterns on the peripheral region, each of the plurality of second embossing patterns extending radially outward from the central embossing pattern with a second length that is less than the first length.

20 Claims, 8 Drawing Sheets

(56) References Cited

U.S. PATENT DOCUMENTS

| | | | |
|---|---|---|---|
| 2016/0181137 A1* | 6/2016 | Lee | C22C 49/14 |
| | | | 118/723 R |
| 2020/0135530 A1 | 4/2020 | Shah et al. | |
| 2020/0303229 A1* | 9/2020 | Ozaki | H01L 21/6833 |
| 2021/0305918 A1 | 9/2021 | Moriya | |

* cited by examiner

SUBSTRATE PROCESSING APPARATUS

PRIORITY STATEMENT

This application claims priority under 35 U.S.C. § 119 to Korean Patent Application No. 10-2022-0142421, filed on Oct. 31, 2022 in the Korean Intellectual Property Office (KIPO), the disclosure of which is herein incorporated by reference in its entirety.

BACKGROUND

1. Field

Example embodiments relate to a substrate processing apparatus. More particularly, example embodiments relate to a substrate processing apparatus being capable of performing a deposition process by a chemical vapor deposition method.

2. Description of the Related Art

A deposition process using a chemical vapor deposition (CVD) process may be performed at high temperature. A semiconductor substrate may be fixedly held on a substrate plate through an electrostatic chuck (ESC). The substrate plate may hold the semiconductor substrate using an electrostatic attraction force, and warpage of the semiconductor substrate on the substrate plate may be increased due to high temperature. An embossing pattern may be provided on a surface of the substrate plate in order to prevent slippage of the semiconductor substrate on the surface of the substrate plate. When the semiconductor substrate held down by the electrostatic attraction force is thermally expanded by the high temperature, a scratch defect may occur in a portion of the semiconductor substrate in contact with the embossing pattern. When the semiconductor substrate is slipped at a corner of the embossing pattern, the scratch defect may be exacerbated.

SUMMARY

Example embodiments provide a substrate processing apparatus including a plurality of embossing patterns capable of reducing or eliminating scratch defects generated on a semiconductor substrate subjected to electrostatic attraction force at high temperature.

According to example embodiments, a substrate processing apparatus includes a chamber providing a space where a semiconductor process is performed on a semiconductor substrate, a substrate plate within the chamber and configured to support the semiconductor substrate, the substrate plate having a central region and a peripheral region extending around the central region, a central embossing pattern on the central region and configured to support a central portion of the semiconductor substrate, a plurality of first embossing patterns on the peripheral region of the substrate plate in circumferentially spaced apart relationship, each of the plurality of first embossing patterns extending radially outward from the central embossing pattern and having a first length, and a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length.

According to example embodiments, a substrate processing apparatus includes a chamber providing a space where a semiconductor process is performed on a semiconductor substrate, a substrate plate within the chamber and configured to support the semiconductor substrate, the substrate plate having a central region and a peripheral region extending around the central region, the substrate plate having an electrostatic electrode that is configured to hold down the semiconductor substrate using an electrostatic attraction force, a central embossing pattern on the central region, the central embossing pattern protruding from an upper surface of the substrate plate and configured to support a central portion of the semiconductor substrate, a plurality of first embossing patterns on the peripheral region of the substrate plate in circumferentially spaced apart relationship, each of the plurality of first embossing patterns extending radially outward from the central embossing pattern and having a first length, and a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length.

According to example embodiments, a substrate processing apparatus includes a chamber providing a space where a semiconductor process is performed on a semiconductor substrate, a substrate plate within the chamber and configured to support the semiconductor substrate, the substrate plate having a central region and a peripheral region extending around the central region, the substrate plate having an electrostatic electrode and a heating portion, the electrostatic electrode configured to fixedly hold the semiconductor substrate by an electrostatic attraction force, the heating portion configured to transfer heat to the semiconductor substrate, a central embossing pattern on the central region, the central embossing pattern protruding from an upper surface of the substrate plate and configured to support a central portion of the semiconductor substrate, the central embossing pattern having a cylindrical shape, a plurality of first embossing patterns on the peripheral region of the substrate plate in circumferentially spaced apart relationship, each of the plurality of first embossing patterns extending radially outward from the central embossing pattern and having a first length, one end portion of each of the plurality of first embossing patterns having a curved shape, wherein the one end portion of each of the plurality of first embossing patterns faces the central embossing pattern, and a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length, wherein one end portion of each of the plurality of second embossing patterns has a curved shape, and wherein the one end portion of each of the second embossing patterns faces the central embossing pattern.

According to example embodiments, a substrate processing apparatus may include a chamber providing a space where a semiconductor process is performed on a semiconductor substrate, a substrate plate within the chamber and configured to support the semiconductor substrate, the substrate plate having a central region and a peripheral region extending around the central region, a central embossing pattern on the central region and configured to support a central portion of the semiconductor substrate, a plurality of first embossing patterns on the peripheral region of the substrate plate in circumferentially spaced apart relationship, each of the plurality of first embossing patterns extending radially outward from the central embossing pattern and having a first length, and a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length.

Thus, the semiconductor process may be referred to a chemical vapor deposition (CVD) process. The semiconductor process may be performed at a high temperature on the semiconductor substrate that is arranged on the substrate plate. The substrate plate may pull the semiconductor substrate through an electrostatic attraction force, and the semiconductor substrate may be in a state in which a degree of warpage easily occurs due to the high temperature. Since each of the first and second embossing patterns extends in a direction in which the semiconductor substrate thermally expands due to the high temperature, even when the semiconductor substrate is pulled by the electrostatic attraction force, generation of scratch defects on the semiconductor substrate may be reduced or eliminated at a region where the semiconductor substrate and the first and second embossing patterns contact each other. When the semiconductor substrate is pulled at a corner portion of each of the first and second embossing patterns, the generation of the scratch defects on the semiconductor substrate may be reduced or eliminated.

Also, the central embossing pattern may support the central portion of the semiconductor substrate. Since each of the first and second embossing patterns extends radially toward the central embossing pattern, the first and second embossing patterns may support the semiconductor substrate together with the central embossing pattern. The central embossing pattern and the first and second embossing patterns may distribute the electrostatic attraction force to a lower surface of the semiconductor substrate, the central embossing pattern and the first and second embossing patterns may stably support the semiconductor substrate to reduce or eliminate scratch defects.

BRIEF DESCRIPTION OF THE DRAWINGS

Example embodiments will be more clearly understood from the following detailed description taken in conjunction with the accompanying drawings. FIGS. 1 to 9 represent non-limiting, example embodiments as described herein.

DETAILED DESCRIPTION OF EXAMPLE EMBODIMENTS

Hereinafter, example embodiments will be explained in detail with reference to the accompanying drawings.

Figure 1:
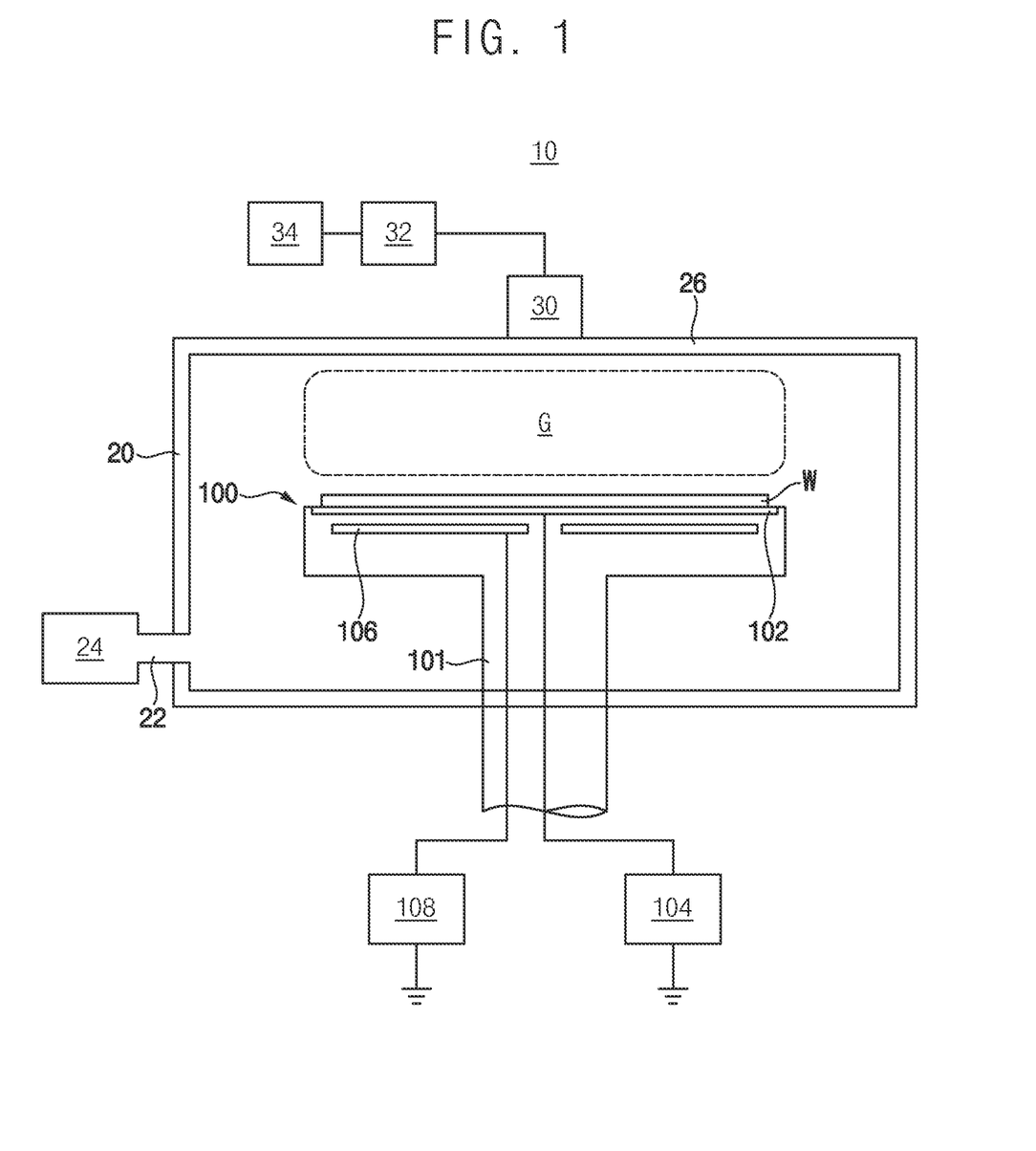
FIG. 1 is a view illustrating a substrate processing apparatus in accordance with example embodiments.
Figure 2:
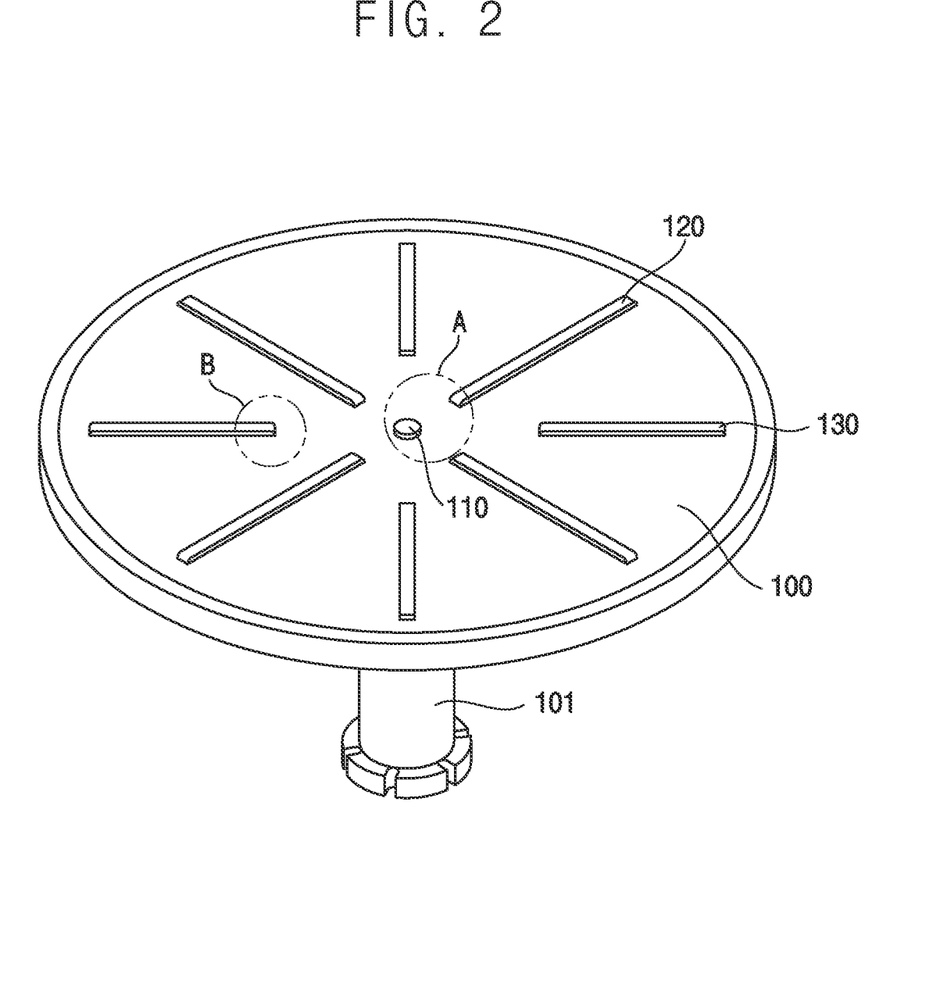
FIG. 2 is a perspective view illustrating a substrate plate having embossing patterns in accordance with example embodiments.
Figure 3:
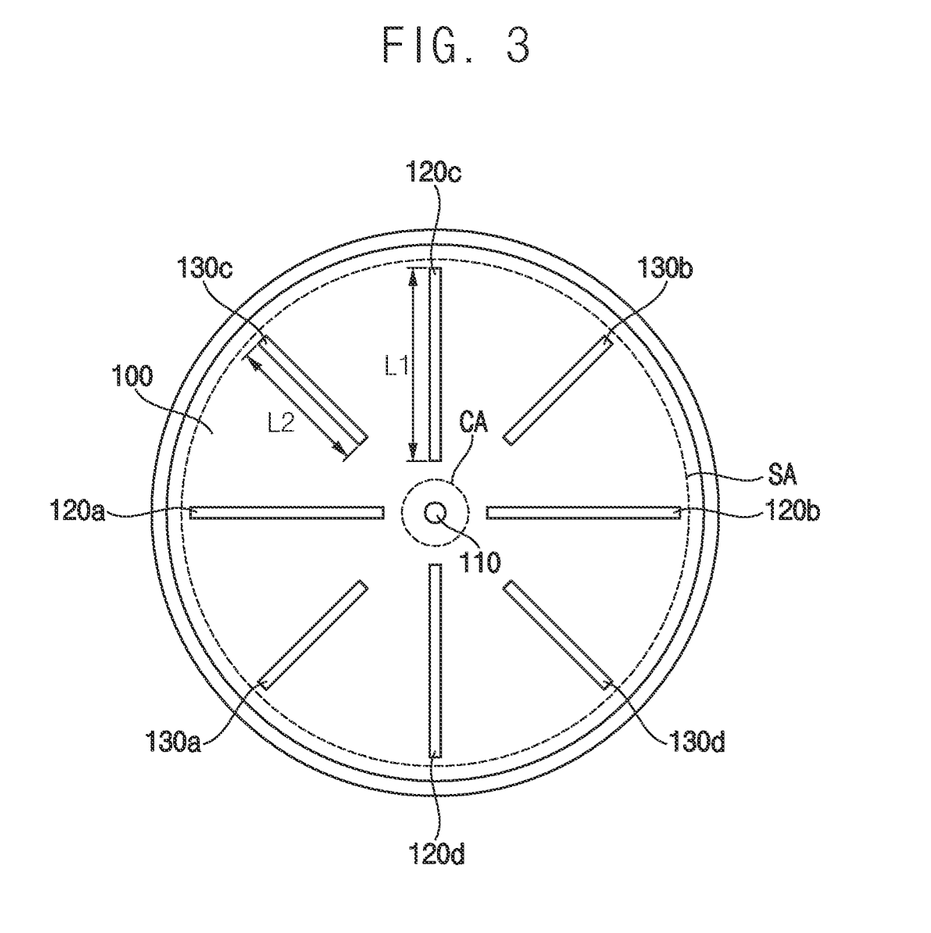
FIG. 3 is a plan view illustrating the substrate plate having the embossing patterns in FIG. 2.
Figure 4:
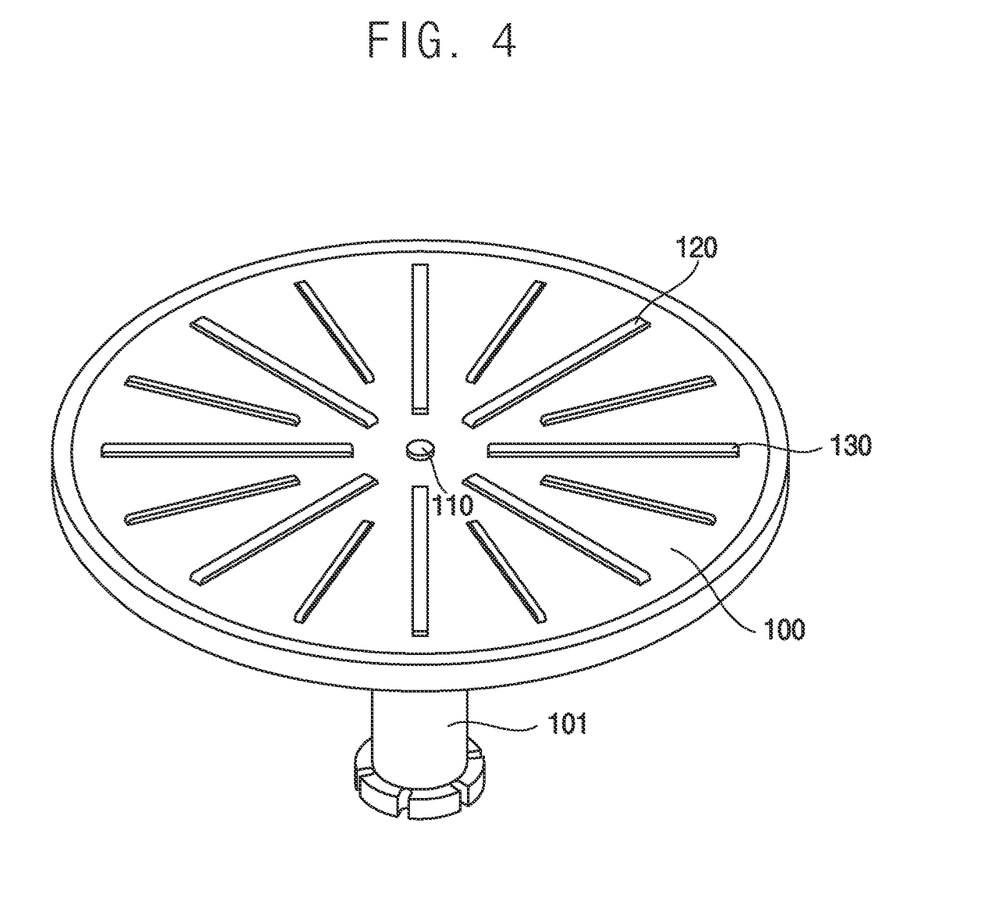
FIG. 4 is a perspective view illustrating a substrate plate having embossing patterns in accordance with example embodiments.
Figure 5:
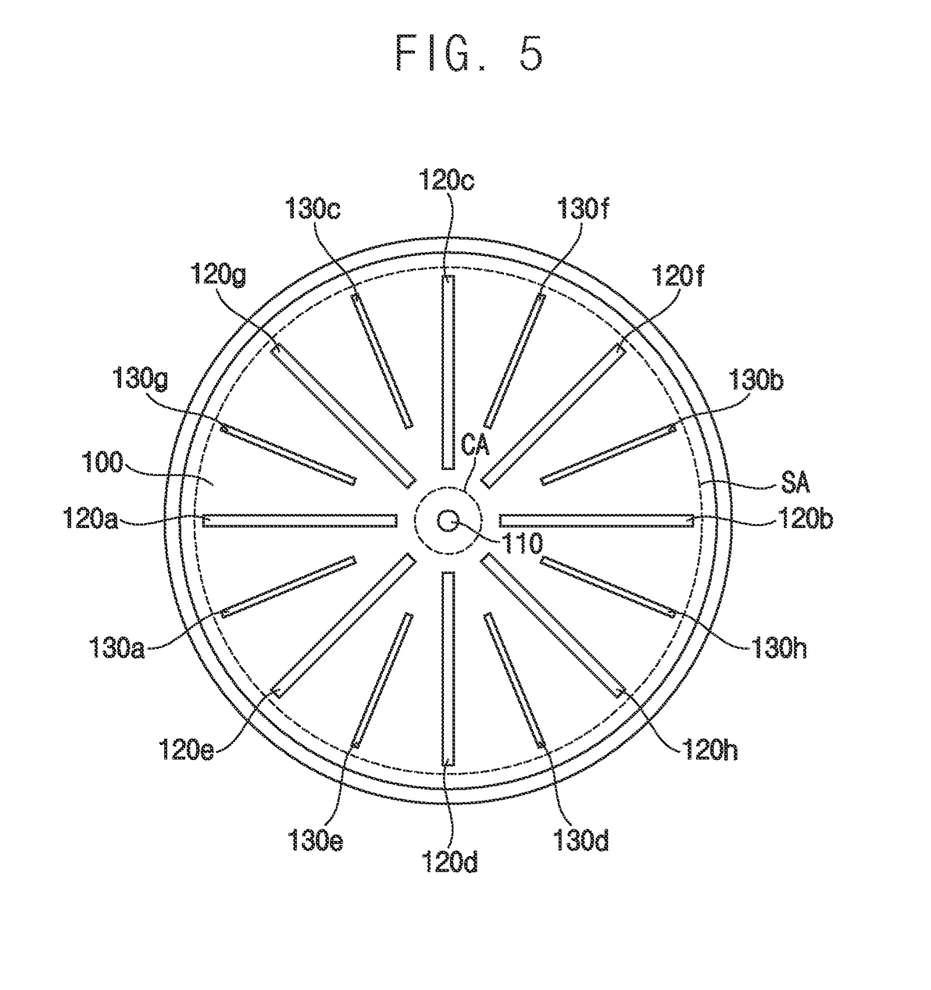
FIG. 5 is a plan view illustrating the substrate plate having the embossing patterns in FIG. 4.
Figure 6:
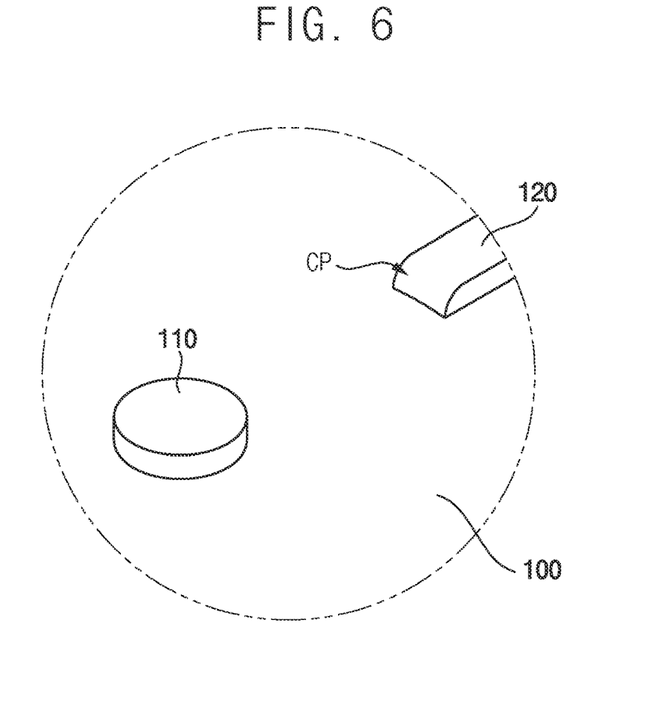
FIG. 6 is an enlarged cross-sectional view illustrating portion 'A' in FIG. 2.
Figure 7:
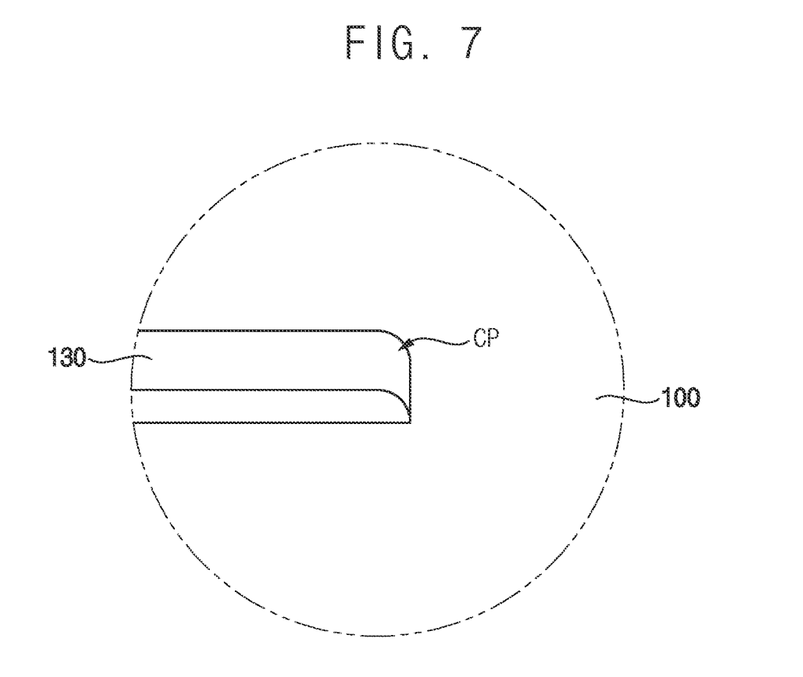
FIG. 7 is an enlarged cross-sectional view illustrating portion 'B' in FIG. 2.

FIG. 1 is a view illustrating a substrate processing apparatus in accordance with example embodiments. FIG. 2 is a perspective view illustrating a substrate plate having embossing patterns in accordance with example embodiments. FIG. 3 is a plan view illustrating the substrate plate having the embossing patterns in FIG. 2. FIG. 4 is a perspective view illustrating a substrate plate having embossing patterns in accordance with example embodiments. FIG. 5 is a plan view illustrating the substrate plate having the embossing patterns in FIG. 4. FIG. 6 is an enlarged cross-sectional view illustrating portion 'A' in FIG. 2. FIG. 7 is an enlarged cross-sectional view illustrating portion 'B' in FIG. 2.

Referring to FIGS. 1 to 7, a substrate processing apparatus 10 may include a chamber 20 providing a space where a semiconductor process, such as a deposition process, is performed on a semiconductor substrate, and a substrate stage having a seating surface that supports the semiconductor substrate.

In example embodiments, the substrate processing apparatus 10 may be referred to as a deposition apparatus that deposits a target film on the semiconductor substrate, the semiconductor substrate may be arranged in the chamber 20 for a Chemical Vapor Deposition (CVD) process. The substrate processing apparatus 10 may not be necessarily limited to the deposition apparatus, and may be referred to as, for example, an etching apparatus, a cleaning apparatus, and the like. The semiconductor substrate may include a silicon substrate, a glass substrate, and the like.

In example embodiments, the chamber 20 may provide an enclosed space within which the deposition process is performed on the semiconductor substrate W. The chamber 20 may include a cylindrical vacuum chamber. The chamber 20 may include a metal such as aluminum or stainless steel.

The substrate stage configured to support the semiconductor substrate W may be provided inside the chamber 20. For example, the substrate stage may serve as a susceptor that is capable of supporting the semiconductor substrate W.

A gate may be provided on a sidewall of the chamber 20 to allow access of the semiconductor substrate W. The semiconductor substrate W may be loaded and unloaded onto the substrate stage through the gate.

An exhaust port 22 may be provided in a lower portion of the chamber 20, and an exhaust portion 24 may be connected to the exhaust port 22 through an exhaust pipe. The exhaust portion 24 may include a vacuum pump such as a turbo molecular pump to adjust the processing space inside the chamber 20 to a desired vacuum pressure. In addition, process by-products and residual process gases generated in the chamber 20 may be discharged through the exhaust port 22.

The chamber 20 may include a cover 26 covering a top portion of the chamber 20. The cover 26 may seal the top portion of the chamber 20.

In example embodiments, the substrate processing apparatus 10 may further include a gas supply portion that is configured to supply gas into the chamber 20. For example, the gas supply portion may include gas supply pipes 30, a flow controller 32, and a gas supply source 34 as gas supply elements. The gas supply pipes 30 may supply various gases to the top portion and/or side portion of the chamber 20. For example, the gas supply pipes may include a vertical gas supply pipe that penetrates through the cover 26, and a horizontal gas supply pipe that penetrates through the side portion of the chamber 20. The vertical gas supply pipe and the horizontal gas supply pipe may directly supply the various gases G into the chamber 20.

The gas supply portion may supply different gases at a desired ratio. The gas supply source 34 may store a plurality of gases, and the gases may be supplied through a plurality of gas lines respectively connected to the gas supply pipes 30. The flow controller 32 may control a supply flow rate of gases that is introduced into the chamber 20 through the gas supply pipes 30. The flow controller 32 may independently or commonly control the supply flow rates of gases that are supplied to the vertical gas supply pipe and the horizontal gas supply pipe, respectively. For example, the gas supply source 34 may include a plurality of gas tanks, and the flow controller 32 may include a plurality of mass flow controllers (MFCs) that respectively correspond to the gas tanks. The mass flow controllers may independently control the supply flow rates of the gases.

In example embodiments, the substrate stage may include substrate plate 100, a shaft 101 supporting the substrate plate 100, a central embossing pattern 110 supporting a central portion of the semiconductor substrate W on the substrate plate 100, and a plurality of first and second embossing patterns 120 and 130 supporting peripheral portions of the semiconductor substrate W on the substrate plate 100.

In example embodiments, the substrate plate 100 may have a central region, CA and a peripheral region SA surrounding the central region CA. When the semiconductor substrate W is arranged on the substrate plate 100, the central portion of the semiconductor substrate W may be located on the central region CA, and the peripheral portion of the semiconductor substrate W may be located on the peripheral region SA.

A lower surface of the substrate plate 100 may be supported by the shaft 101. For example, the substrate plate 100 may rotate by receiving rotational force from the shaft 101. The substrate plate 100 may rotate clockwise or counterclockwise by the shaft 101.

The substrate plate 100 may include a first material. The first material may include metallic or ceramic materials. For example, the metallic or the ceramic materials may include metals, metal oxides, metal nitrides, metal oxynitrides, or any alloy thereof. The substrate plate 100 may include aluminum, aluminum oxide, aluminum nitride, aluminum oxynitride, or any alloy thereof.

The substrate plate 100 may include an electrostatic electrode 102 that is configured to hold the semiconductor substrate W with an electrostatic attraction force thereon. The electrostatic electrode 102 may adsorb and hold the semiconductor substrate W with static power by first DC voltage that is supplied from the first power supply 104.

The semiconductor substrate W may be arranged on an upper portion of the electrostatic electrode 102, and a focus ring may be provided around the semiconductor substrate W. In addition, the substrate plate 100 may have a circulation channel that is configured to cool therein. A cooling gas such as He gas may be supplied between the electrostatic electrode 102 and the semiconductor substrate W to precisely control temperature of the semiconductor substrate.

The substrate plate 100 may further include a heating portion 106 that is configured to transfer heat to the semiconductor substrate W. The heating portion 106 may generate the heat to perform the deposition process through a second DC voltage that is supplied from the second power supply 108. The semiconductor substrate W may generate thermal expansion by the heat. The semiconductor substrate W may be expanded and deformed in a radial direction due to the thermal expansion.

In example embodiments, the central embossing pattern 110 may be provided on the central region CA of the substrate plate 100. The central embossing pattern 110 may support the central portion of the semiconductor substrate W when the semiconductor substrate W is positioned on the substrate plate 100.

Since the central embossing pattern 110 supports the central portion of the semiconductor substrate W, when the semiconductor substrate (W) is deformed by the thermal expansion, the semiconductor substrate W may be expanded and deformed based on the central embossing pattern 110. The semiconductor substrate W may be uniformly expanded in the radial direction based on the central embossing pattern 110.

The central embossing pattern 110 may include a cylinder shape, a circular truncated cone shape, and a frustum of quadrangular pyramid shape.

The central embossing pattern 110 may include a second material that is same as the first material of the substrate plate 100.

In example embodiments, the plurality of first embossing patterns 120 may be provided on the peripheral region SA of the substrate plate 100. The first embossing patterns 120 may be radially arranged on the substrate plate 100, as illustrated in FIG. 2.

The first embossing pattern 120 may include the same second material as the first material of the substrate plate 100.

A pair of the first embossing patterns 120a and 120b may extend parallel to each other on the substrate plate 100, as illustrated in FIG. 3. The pair of first embossing patterns 120a and 120b may be arranged to be spaced apart from each other on the substrate plate 100. Both ends of the pair of first embossing patterns 120a and 120b may be arranged on the substrate plate 100 to face each other. The pair of first embossing patterns 120a and 120b may be arranged symmetrically with respect to the central embossing pattern 110.

The first embossing pattern 120 may extend from the peripheral portion of the substrate plate 100 toward the central embossing pattern 110. The first embossing pattern 120 may be radially arranged around the central embossing pattern 110, as illustrated in FIG. 3. The first embossing pattern 120 may extend with a first length L1. The first embossing pattern 120 may have a first thickness from an upper surface of the substrate plate 100. For example, the first length L1 may be within a range of 100 mm to 150 mm. The first thickness may be within a range of 25 μm to 35 μm.

The first embossing patterns 120 may be arranged radially on the substrate plate 100 to uniformly divide the peripheral region SA of the substrate plate 100. The first embossing patterns 120 may be arranged in a circumferential direction on the substrate plate 100 (i.e., the first embossing patterns 120 are circumferentially spaced apart around the substrate plate 100). The first embossing patterns 120 may be arranged symmetrically with respect to the central embossing pattern 110.

The first embossing patterns 120 may be provided in a first number on the substrate plate 100. The first number of the first embossing patterns 120 may vary according to a type of the semiconductor substrate W on which the substrate processing apparatus 10 performs the deposition process therein. For example, the first number of first embossing patterns 120 may be within a range of 4 to 20.

As illustrated in FIGS. 2 and 3, when the first number of the first embossing patterns 120a, 120b, 120c, and 120d is four, the first embossing patterns 120a, 120b, 120c, and 120d may divide the upper surface of the substrate plate 100 into 4 equal portions.

Alternatively, as illustrated in FIGS. 4 and 5, when the first number of the first embossing patterns 120a, 120b, 120c, 120d, 120e, 120f, 120g, and 120h is eight, the first embossing pattern 120a, 120b, 120c, 120d, 120e, 120f, 120g, and 120h may divide the upper surface of the substrate plate 100 into eight equal portions.

As illustrated in FIG. 6, the first embossing pattern 120 may include one end that has a curved shape CP adjacent to the central embossing pattern, and the one end of the first embossing pattern 120 may provide to face the central embossing pattern. The first embossing pattern 120 may reduce deformation of the semiconductor substrate W through the curved shape CP. When the semiconductor substrate W expands in the radial direction by the thermal expansion, the curved shape CP of the first embossing pattern 120 may reduce friction with the semiconductor substrate W.

In example embodiments, the plurality of second embossing patterns 130 may be provided on the peripheral region SA of the substrate plate 100. The second embossing patterns 130 may be respectively provided between the first embossing patterns 120. The second embossing patterns 130 may be arranged radially on the substrate plate 100, as illustrated in FIG. 2.

The second embossing pattern 130 may include the same second material as the first material of the substrate plate 100.

A pair of the second embossing patterns 130a and 130b may extend parallel to each other on the substrate plate 100, as illustrated in FIG. 3. The pair of second embossing patterns 130a and 130b may be arranged to be spaced apart from each other on the substrate plate 100. Both ends of the pair of second embossing patterns 130a and 130b may be arranged on the substrate plate 100 to face each other. The pair of second embossing patterns 130a and 130b may be arranged symmetrically with respect to the central embossing pattern 110.

The second embossing pattern 130 may extend from the peripheral portion of the substrate plate 100 toward the central embossing pattern 110. The second embossing pattern 130 may be radially arranged around the central embossing pattern 110. The second embossing pattern 130 may extend with a second length L2 that is shorter than the first length L1. For example, the second length L2 may be within a range of 30 mm to 100 mm.

The second embossing pattern 130 may have a second thickness that is equal to the first thickness from the upper surface of the substrate plate 100. The second embossing patterns 130 may support the semiconductor substrate W on the same plane with the first embossing patterns 120 through the second thickness. For example, the second thickness may be within a range of 25 μm to 35 μm.

The second embossing patterns 130 may uniformly divide areas between the first embossing patterns 120 on the substrate plate 100. The second embossing patterns 130 may be arranged in the circumferential direction on the substrate plate 100 (i.e., the second embossing patterns 130 are circumferentially spaced apart around the substrate plate 100). The second embossing patterns 130 may be arranged symmetrically with respect to the central embossing pattern 110.

A second number of the second embossing patterns 130 may be provided on the substrate plate 100. The second number of second embossing patterns 130 may vary according to the type of the semiconductor substrate W on which the substrate processing apparatus 10 performs the deposition process therein. For example, the second number of second embossing patterns 130 may be within a range of 4 to 20.

As illustrated in FIGS. 2 and 3, when each of the first number of first embossing patterns 120a, 120b, 120c and 120d and the second number of second embossing patterns 130a, 130b, 130c and 130d is four, the one second embossing pattern 130a may divide an area between the pair of the first embossing patterns 120a and 120d that are adjacent to each other into two equal portions, and the second embossing patterns 130a, 130b, 130c, and 130d may divide the upper surface of the substrate plate 100 into eight equal portions together with the first embossing patterns 120a, 120b, 120c, and 120d.

Alternatively, as illustrated in FIGS. 4 and 5, when each of the first number of first embossing patterns 120a, 120b, 120c, 120d, 120e, 120f, 120g, and 120h and the second embossing patterns 130a, 130b, 130c, 130d, 130e, 130f, 130g and 130h is 8, the one second embossing pattern 130a may divide an area between the pair of first embossing patterns 120a and 120e that are adjacent to each other into two equal portions, and the second embossing patterns 130a, 130b, 130c, 130d, 130e, 130f, 130g, and 130h may divide the upper surface of the substrate plate 100 into sixteen equal portions together with the first embossing patterns 120a, 120b, 120c, 120d, 120e, 120f, 120g and 120h.

Figure 8:
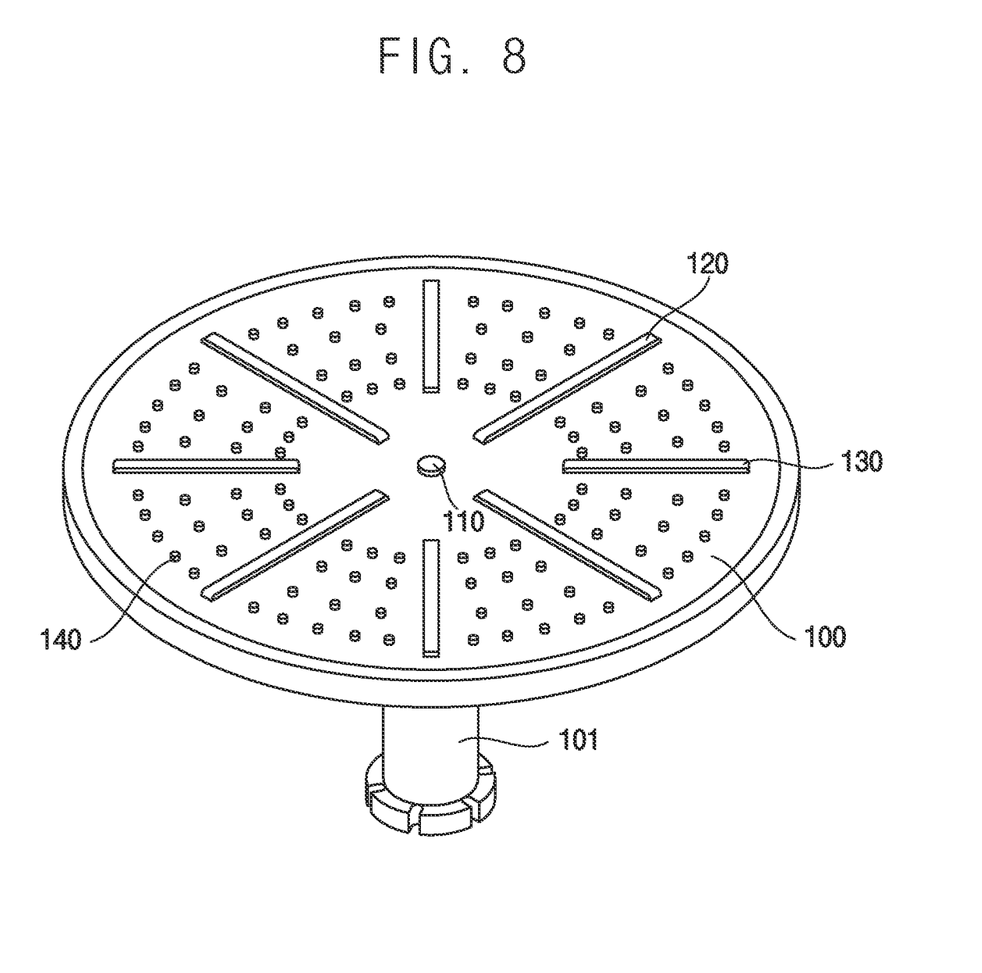
FIG. 8 is a perspective view illustrating a substrate plate of a substrate processing apparatus having sub-embossing patterns in accordance with example embodiments.

As illustrated in FIG. 8, the second embossing pattern 130 may include one end that has the curved shape CP adjacent to the central embossing pattern, and the one end of the second embossing pattern 130 may face the central embossing pattern. The second embossing pattern 130 may reduce the deformation of the semiconductor substrate W through the curved shape CP. When the semiconductor substrate W expands in the radial direction by the thermal expansion, the curved shape CP of the second embossing pattern 130 may reduce friction with the semiconductor substrate W.

In example embodiments, entire upper surfaces of the first and second embossing patterns 120 and 130 may have a first area (upper area) A1. A ratio (A1/A0) of the first area A1 of the first and second embossing patterns to an area A0 of the substrate plate may be within a range of 0.03 to 0.15.

The first and second embossing patterns 120 and 130 may support the semiconductor substrate W without interfering with the heat that is transferred to the semiconductor substrate W through the upper area A1. The substrate processing apparatus 10 may efficiently transfer the heat to the semiconductor substrate W through the ratio (A1/A0) of the upper area A1 of the first and second embossing patterns 120 and 130 and the area A0 of the substrate plate.

Thus, the semiconductor process may be performed at a high temperature on the semiconductor substrate W that is arranged on the substrate plate 100. The substrate plate 100 may pull the semiconductor substrate W through the electrostatic attraction force, and the semiconductor substrate W may be in a state in which a degree of warpage easily occurs due to the high temperature. Since each of the first and second embossing patterns 120 and 130 extends in a direction in which the semiconductor substrate W thermally expands due to the high temperature, even when the semiconductor substrate W is pulled by the electrostatic attraction force, generation of scratch defects on the semiconductor substrate W may be reduced or eliminated at a portion where the semiconductor substrate W and the first and second embossing patterns 120 and 130 contact each other. When the semiconductor substrate W is pulled at a corner portion of each of the first and second embossing patterns 120 and 130, the generation of the scratch defects on the semiconductor substrate W may be reduced or eliminated.

Also, the central embossing pattern 110 may support the central portion of the semiconductor substrate W. Since each of the first and second embossing patterns 120 and 130 extends toward the central embossing pattern 110, the first and second embossing patterns 120 and 130 may support the semiconductor substrate W together with the central embossing pattern 110. The central embossing pattern 110 and the first and second embossing patterns 120 and 130 may distribute the electrostatic attraction force to the lower surface of the semiconductor substrate W. The central embossing pattern 110 and the first and second embossing patterns 120 and 130 may stably support the semiconductor substrate W to reduce or eliminate scratch defects.

Figure 9:
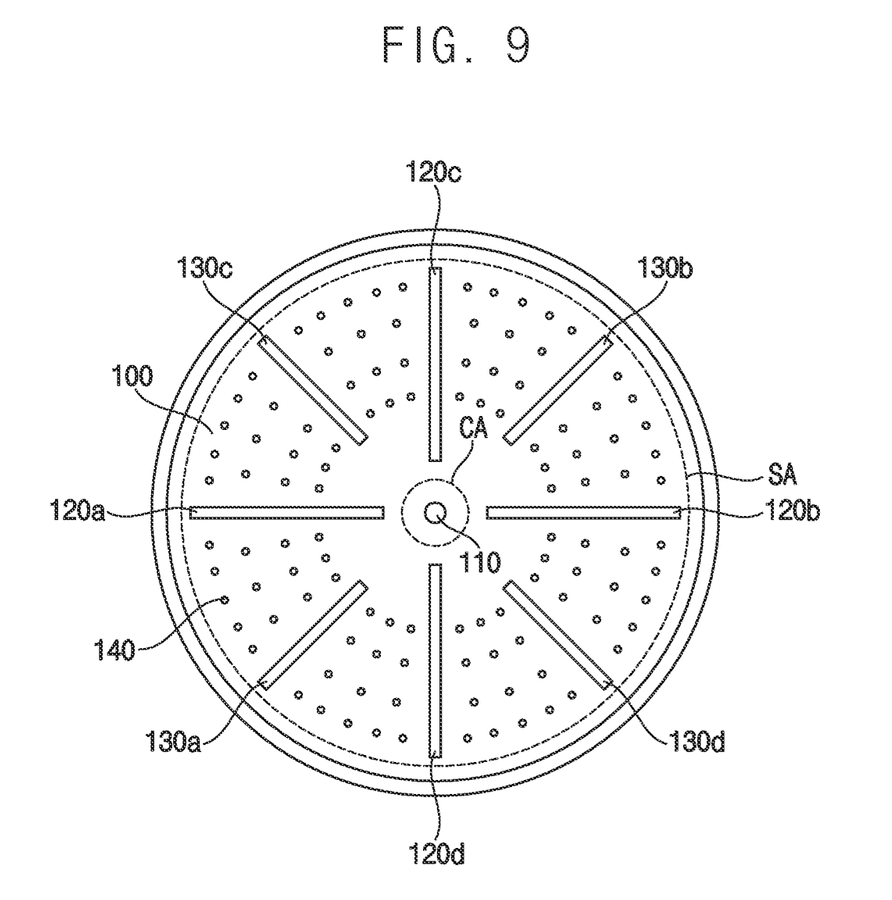
FIG. 9 is a plan view illustrating the substrate plate having the sub-embossing patterns in FIG. 8.

FIG. 8 is a perspective view illustrating a substrate plate of a substrate processing apparatus having sub-embossing patterns in accordance with example embodiments. FIG. 9 is a plan view illustrating the substrate plate having the sub-embossing patterns in FIG. 8. The substrate processing apparatus may be substantially the same as or similar to the substrate processing apparatus described with reference to FIGS. 1 to 7 except for a configuration of the sub-embossing patterns. Thus, same or similar components are denoted by the same or similar reference numerals, and repeated descriptions of the same components will be omitted.

Referring to FIGS. 8 and 9, the substrate stage of the substrate processing apparatus 10 may include the substrate plate 100, the shaft 101 supporting the substrate plate 100, the central embossing pattern 110 supporting the central portion of the semiconductor substrate W on the substrate plate 100, the plurality of first and second embossing patterns 120 and 130 supporting the peripheral portion of the semiconductor substrate W on the substrate plate 100, and a plurality of sub-embossing patterns 140.

In example embodiments, the sub-embossing patterns 140 may be provided between the first and second embossing patterns 120 and 130. The sub-embossing patterns 140 may be arranged radially on the substrate plate 100, as illustrated in FIGS. 8-9. The sub-embossing patterns 140 may be arranged symmetrically with respect to the central embossing pattern 110, as illustrated in FIGS. 8-9.

The sub-embossing patterns 140 may be arranged along the circumferential direction between the first and second embossing patterns 130 (i.e., the sub-embossing patterns 140 are circumferentially spaced apart around the substrate plate 100. The sub-embossing patterns 140 may support the lower surface of the semiconductor substrate W that is not supported by the first and second embossing patterns 120 and 130. An arrangement of the sub-embossing patterns 140 may vary according to the type of the semiconductor substrate W.

Each of the sub-embossing patterns 140 may have a third thickness that is equal to the first thickness of a first embossing pattern 120 and the second thickness of a second embossing pattern 130. The sub-embossing patterns 140 may support the semiconductor substrate W on the same plane with the first and second embossing patterns 120 and 130 through the third thickness. For example, the third thickness may be within a range of 25 μm to 35 μm.

Each of the sub-embossing patterns 140 may have a cylinder shape, a circular truncated cone shape, or a frustum of quadrangular pyramid shape.

The sub-embossing patterns 140 may include the same second material as the first material of the substrate plate 100.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing apparatus, comprising:
   a chamber providing a space where a semiconductor process is performed on a semiconductor substrate;
   a substrate plate within the chamber and configured to support the semiconductor substrate, the substrate plate comprising a central region and a peripheral region extending around the central region;
   a central embossing pattern on the central region of the substrate plate and configured to support a central portion of the semiconductor substrate;
   a plurality of first embossing patterns on the peripheral region of the substrate plate in circumferentially spaced apart relationship, each of the plurality of first embossing patterns extending radially outward from the central embossing pattern and having a first length; and
   a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length,
   wherein an end portion of each of the first and second embossing patterns that faces the central embossing pattern has a curved shape.

2. The substrate processing apparatus of claim 1, wherein the substrate plate further comprises a heating portion that is configured to transfer heat to the semiconductor substrate.

3. The substrate processing apparatus of claim 1, wherein the substrate plate further comprises an electrostatic electrode that is configured to secure the semiconductor substrate to the substrate plate using an electrostatic attraction force.

4. The substrate processing apparatus of claim 1, wherein a number of each of the first and second embossing patterns is within a range of 4 to 20.

5. The substrate processing apparatus of claim 1, wherein the first length of each of the first embossing patterns is within a range of 100 mm to 150 mm, and
   wherein the second length of each of the second embossing patterns is within a range of 30 mm to 100 mm.

6. The substrate processing apparatus of claim 1, wherein a ratio of an upper area of each of the first and second embossing patterns to an area of the substrate plate is within a range of 0.03 to 0.15.

7. The substrate processing apparatus of claim 1, further comprising:
   a plurality of sub-embossing patterns on the peripheral region of the substrate plate between the first and second embossing patterns, each of the plurality of sub-embossing patterns having a cylindrical shape.

8. The substrate processing apparatus of claim 1, wherein the plurality of first embossing patterns and the plurality of second embossing patterns have a thickness from an upper surface of the substrate plate within a range of 25 μm to 35 μm.

9. The substrate processing apparatus of claim 1, wherein the central embossing pattern and the first and second embossing patterns comprise a same material as the substrate plate.

10. The substrate processing apparatus of claim 1, wherein the central embossing pattern has one of a cylinder shape, a circular truncated cone shape, and a frustum of quadrangular pyramid shape.

11. A substrate processing apparatus, comprising:
a chamber providing a space where a semiconductor process is performed on a semiconductor substrate;
a substrate plate within the chamber and configured to support the semiconductor substrate, the substrate plate comprising a central region and a peripheral region extending around the central region, and an electrostatic electrode configured to secure the semiconductor substrate to the substrate plate using an electrostatic attraction force;
a central embossing pattern on the central region of the substrate plate, the central embossing pattern protruding from an upper surface of the substrate plate and configured to support a central portion of the semiconductor substrate;
a plurality of first embossing patterns on the peripheral region of the substrate plate in circumferentially spaced apart relationship, each of the plurality of first embossing patterns extending radially outward from the central embossing pattern and having a first length;
a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length; and
a plurality of sub-embossing patterns on the peripheral region of the substrate plate between the first and second embossing patterns, each of the plurality of sub-embossing patterns having a cylindrical shape.

12. The substrate processing apparatus of claim 11, wherein the substrate plate further comprises a heating portion that is configured to transfer heat to the semiconductor substrate.

13. The substrate processing apparatus of claim 11, wherein a number of each of the first and second embossing patterns is within a range of 4 to 20.

14. The substrate processing apparatus of claim 11, wherein the first length of each of the first embossing patterns is within a range of 100 mm to 150 mm, and
wherein the second length of each of the second embossing patterns is within a range of 30 mm to 100 mm.

15. The substrate processing apparatus of claim 11, wherein a ratio of an upper area of each of the first and second embossing patterns to an area of the substrate plate is within a range of 0.03 to 0.15.

16. The substrate processing apparatus of claim 11, wherein the plurality of first embossing patterns and the plurality of second embossing patterns have a thickness from the upper surface of the substrate plate within a range of 25 μm to 35 μm.

17. The substrate processing apparatus of claim 11, wherein an end portion of each of the first and second embossing patterns that faces the central embossing pattern has a curved shape.

18. The substrate processing apparatus of claim 11, wherein the central embossing pattern and the first and second embossing patterns comprise a same material as the substrate plate.

19. The substrate processing apparatus of claim 11, wherein the central embossing pattern has one of a cylinder shape, a circular truncated cone shape, and a frustum of quadrangular pyramid shape.

20. A substrate processing apparatus, comprising:
a chamber providing a space where a semiconductor process is performed on a semiconductor substrate;
a substrate plate within the chamber and configured to support the semiconductor substrate, the substrate plate comprising a central region, a peripheral region extending around the central region, an electrostatic electrode, and a heating portion, wherein the electrostatic electrode is configured to secure the semiconductor substrate to the substrate plate by an electrostatic attraction force, and wherein the heating portion is configured to transfer heat to the semiconductor substrate;
a central embossing pattern on the central region of the substrate plate, the central embossing pattern protruding from an upper surface of the substrate plate and configured to support a central portion of the semiconductor substrate, the central embossing pattern having a cylindrical shape;
a plurality of first embossing patterns on the peripheral region of the substrate plate in circumferentially spaced apart relationship, each of the plurality of first embossing patterns extending radially outward from the central embossing pattern and having a first length, wherein one end portion of each of the plurality of first embossing patterns has a curved shape, and wherein the one end portion of each of the plurality of first embossing patterns faces the central embossing pattern; and
a plurality of second embossing patterns on the peripheral region of the substrate plate, each of the plurality of second embossing patterns located between adjacent ones of the first embossing patterns, each of the plurality of second embossing patterns extending radially outward from the central embossing pattern and having a second length that is less than the first length, wherein one end portion of each of the plurality of second embossing patterns has a curved shape, and wherein the one end portion of each of the second embossing patterns faces the central embossing pattern.

* * * * *